United States Patent
Gibson et al.

(10) Patent No.: US 6,420,933 B1
(45) Date of Patent: Jul. 16, 2002

(54) LOW DISTORTION CURRENT-TO-CURRENT CONVERTER

(75) Inventors: Neil Gibson, Richardson; Leland S. Swanson, McKinney; Marco Corsi, Parker, all of TX (US)

(73) Assignee: Texas Instruments Incorporated, Dallas, TX (US)

(*) Notice: Subject to any disclaimer, the term of this patent is extended or adjusted under 35 U.S.C. 154(b) by 26 days.

(21) Appl. No.: 09/716,597

(22) Filed: Nov. 20, 2000

(51) Int. Cl.[7] .............................. H03F 3/18; H03F 3/26; H03F 3/04
(52) U.S. Cl. ..................... 330/263; 330/267; 330/288
(58) Field of Search ................................. 330/263, 267, 330/288

(56) References Cited

U.S. PATENT DOCUMENTS

| | | | | |
|---|---|---|---|---|
| 4,101,734 A | * | 7/1978 | Dao | 178/70 R |
| 4,484,148 A | * | 11/1984 | Wieser et al. | 330/253 |
| 5,659,266 A | * | 8/1997 | Shacter et al. | 330/263 |
| 5,786,731 A | * | 7/1998 | Bales | 330/265 |
| 6,313,682 B1 | * | 11/2001 | Muller et al. | 327/291 |

* cited by examiner

Primary Examiner—Robert Pascal
Assistant Examiner—Patricia T. Nguyen
(74) Attorney, Agent, or Firm—William B. Kempler; Dwight N. Holmbo; Frederick J. Telecky, Jr.

(57) ABSTRACT

A current-to-current impedance converter re-circulates the driver transistor collector current back into the output current path to generate an error current that has two portions including a DC offset portion and a second order in $1/\beta$ portion. Since the error current has no first order in $1/\beta$ portion, the current-to-current ronverter exhbits very low distortion.

20 Claims, 3 Drawing Sheets

LOW DISTORTION CURRENT-TO-CURRENT CONVERTER

BACKGROUND OF THE INVENTION

1. Field of the Invention

This invention relates generally to current-to-current impedance converter circuits, and more particularly to a current-to-current converter circuit and method to achieve very low distortion.

2. Description of the Prior Art

Current-to-current impedance converter circuits are intended to output a current from a high impedance node that is equal in magnitude to a current input into a separate low impedance node. The potential at this input node is ideally a circuit common mode voltage. Such impedance converter circuits are problematic in that there is presently no known way to implement such a device without the current path proceeding through collector-emitter junctions of transistors.

Conventional current-to-current converter circuit architectures therefore generate an output current that is distorted by errors due to variation of the finite gain ($\beta$) of the transistors with collector current. In the prior art, these errors are proportional to $1/\beta$. Because $\beta$ is a function of collector current, and hence, input signal level, distortion from these error terms will dominate the overall distortion of the circuit.

In view of the foregoing, a need exists for a technique that mitigates the effects of $\beta$ on the foregoing error terms, and thus the error current to provide a current-to-current impedance converter that exhibits very low distortion.

SUMMARY OF THE INVENTION

To meet the above and other objectives, the present invention provides a current-to-current impedance converter that exhibits very low distortion due to ( effects.

According to one embodiment, a current-to-current impedance converter is implemented with a class 'AB' output stage such that the driver transistor collector currents are circulated through suitably chosen output current mirrors along with the collector currents of the class 'AB' output stage output transistors. The total collector current is folded around by the suitably chosen current mirrors, and the bias currents are subtracted, leaving the output current. The current mirrors can be implemented using any well-known mirror architecture and can be implemented to have any suitable gain so long as the selected gain is common to all the current mirrors. The resulting error current includes a DC offset portion and only a second order in $1/\beta$ portion, thereby providing a significant improvement over conventional current-to-current impedance converters that have a DC offset portion and a first order in $1/\beta$ portion.

According to another embodiment, a current-to-current impedance converter is implemented with a class 'AB' output stage such that the driver transistor collectors are connected to the input current summing node of the class 'AB' output stage output transistors. The driver collector currents here are also forced to proceed out through suitably chosen identical current mirrors, where error terms that are first order in $1/\beta$ are subtracted and cancelled at an output summing node. The resulting error current again includes a DC offset portion and only a second order in $1/\beta$ portion.

Another embodiment implements a current-to-current impedance converter using a class 'AB' output stage such that the driver transistor collectors are connected to their respective source and sink output transistor collectors. The collector currents associated with the source output transistor and its respective driver transistor are folded around a first current path by a first current mirror while the collector currents associated with the sink output transistor and its respective driver transistor are folded around a second current path by a second current mirror. The currents in the first and second current paths are combined at a common output node to generate an output current in which the resulting error current includes a DC offset portion and only a second order in $1/\beta$ portion, thereby providing a significant improvement over conventional current-to-current impedance converters that have a DC offset portion and a first order in $1/\beta$ portion.

In one aspect of the invention, a current-to-current impedance converter is implemented that exhibits very low distortion.

In another aspect of the invention, a current-to-current impedance converter is implemented that accommodates a plurality of applications and processes used to fabricate the converter.

In yet another aspect of the invention, a current-to-current impedance converter can be implemented that selectively minimizes the effects of Miller capacitance at the driver stage.

In still another aspect of the invention, a current-to-current impedance converter can be implemented that selectively minimizes the effects of driver transistor collector-substrate capacitance.

BRIEF DESCRIPTION OF THE DRAWINGS

Other aspects and features and many of the attendant advantages of the present invention will be readily appreciated, as the same become better understood by reference to the following detailed description, when considered in connection with the accompanying drawings in which like reference numerals designate like parts throughout the figures thereof, and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Current-to-current impedance converter circuits are intended to output a current from a high impedance node that is equal in magnitude to a current input into a separate low impedance node, as stated herein before. The potential of this input node is ideally a circuit common mode voltage. In this regard, there is no presently known method or circuit architecture to implement such a device without the current path proceeding through collector-emitter junctions of transistors, also as stated herein before. The output current therefore, is distorted by errors due to the variation of the finite gain (β) of the transistors with variations in collector current.

Figure 1:
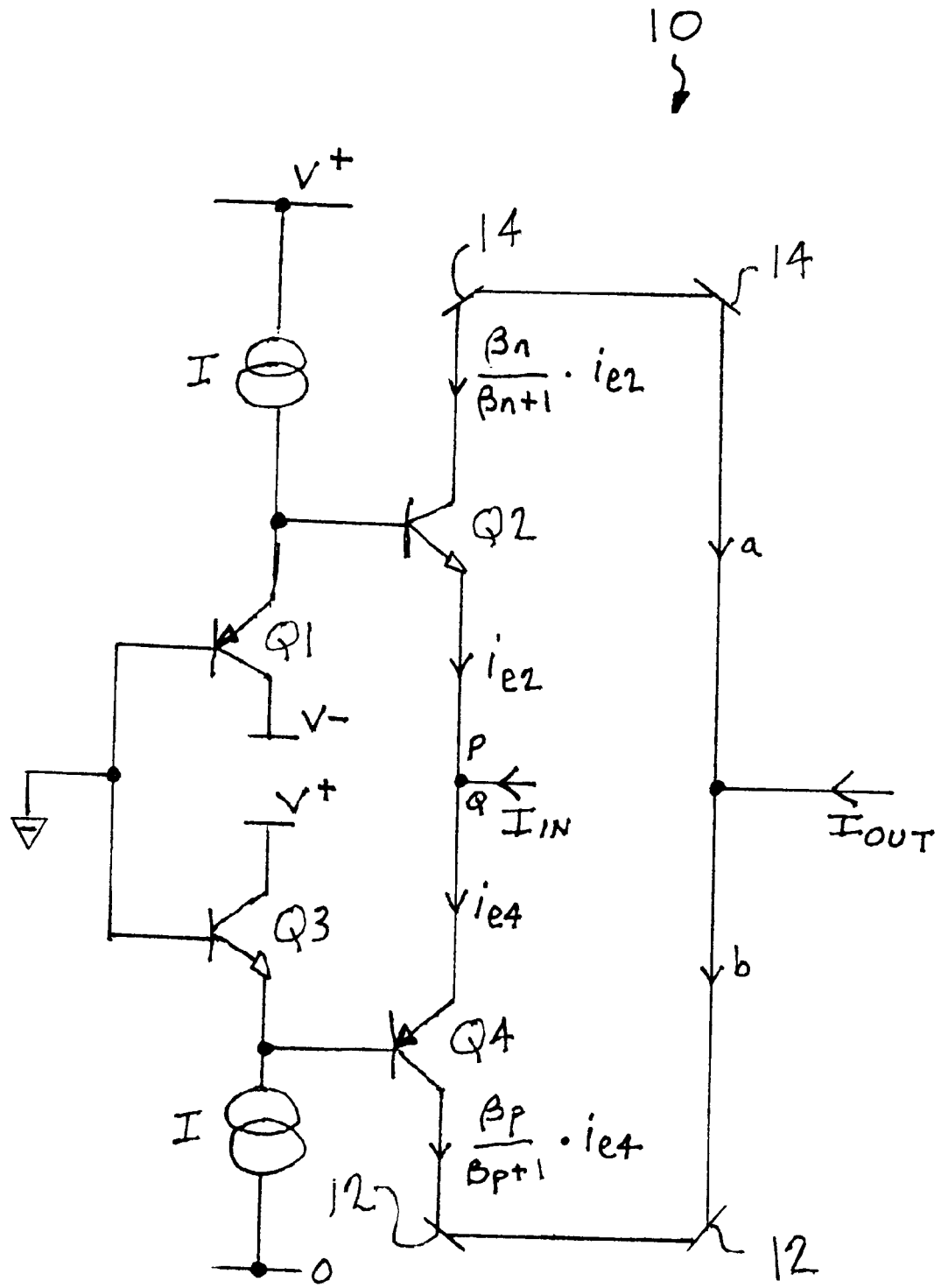
FIG. 1 is a schematic diagram illustrating a conventional current-to-current impedance converter circuit that is known in the prior art.

FIG. 1 is a schematic diagram illustrating a conventional current-to-current impedance converter circuit 10 that is known in the prior art. The impedance converter circuit 10 is implemented via a class 'AB' amplifier output stage that is connected to a plurality of current mirrors (enumerated as 12 and 14). In the prior art current-to-current impedance converter circuit 10, the output current includes an additional error term that is proportional to 1/β. Because β is a function of collector current, and hence, input signal level, distortion from these error terms will dominate the overall distortion of the circuit 10. With continued reference now to FIG. 1, the output error current associated with the conventional current-to-current impedance converter circuit 10 can be shown to be:

$$I_{OUT}+a=b$$

$$I_{OUT}=b-a$$

$$I_{IN}+p=q$$

$$I_{IN}=q-p$$

$$I_{OUT}=[\beta_p/(\beta_p+1)]\cdot i_{e4}-[\beta_n/(\beta_n+1)]\cdot i_{e2}$$

$$I_{IN}=i_{e4}-i_{e2}$$

$$\begin{aligned} error = I_{OUT} - I_{IN} &= [\beta_p/(\beta_p+1)]\cdot i_{e4} - i_{e4} - [\beta_n/(\beta_n+1)]\cdot i_{e2} - i_{e2} \\ &= [\beta_p/(\beta_p+1)]\cdot i_{e4} - [(\beta_p+1)/(\beta_p+1)]i_{e4} - \\ &\quad [\beta_n/(\beta_n+1)]\cdot i_{e2}[(\beta_n+1)/(\beta_n+1)]\cdot i_{e2} \\ &= -i_{e4}/(\beta_p+1) + i_{e2}/(\beta_n+1), \text{ and therefore} \end{aligned}$$

$$\text{error current} = I_{OUT} - I_{IN} = -I_{IN}/(\beta_p+1) + [\beta_p/(\beta_p+1) - \beta_n/(\beta_n+1)]i_{e2} \quad (1)$$

where, for large β, and a bias current I:

$$i_{e2} \approx I_{IN}/2\{[1+4(I/I_{IN})^2]^{1/2}-1\},$$

and for large β, the last term in equation (1) is approximately zero, and contributes little additional distortion.

Figure 2:
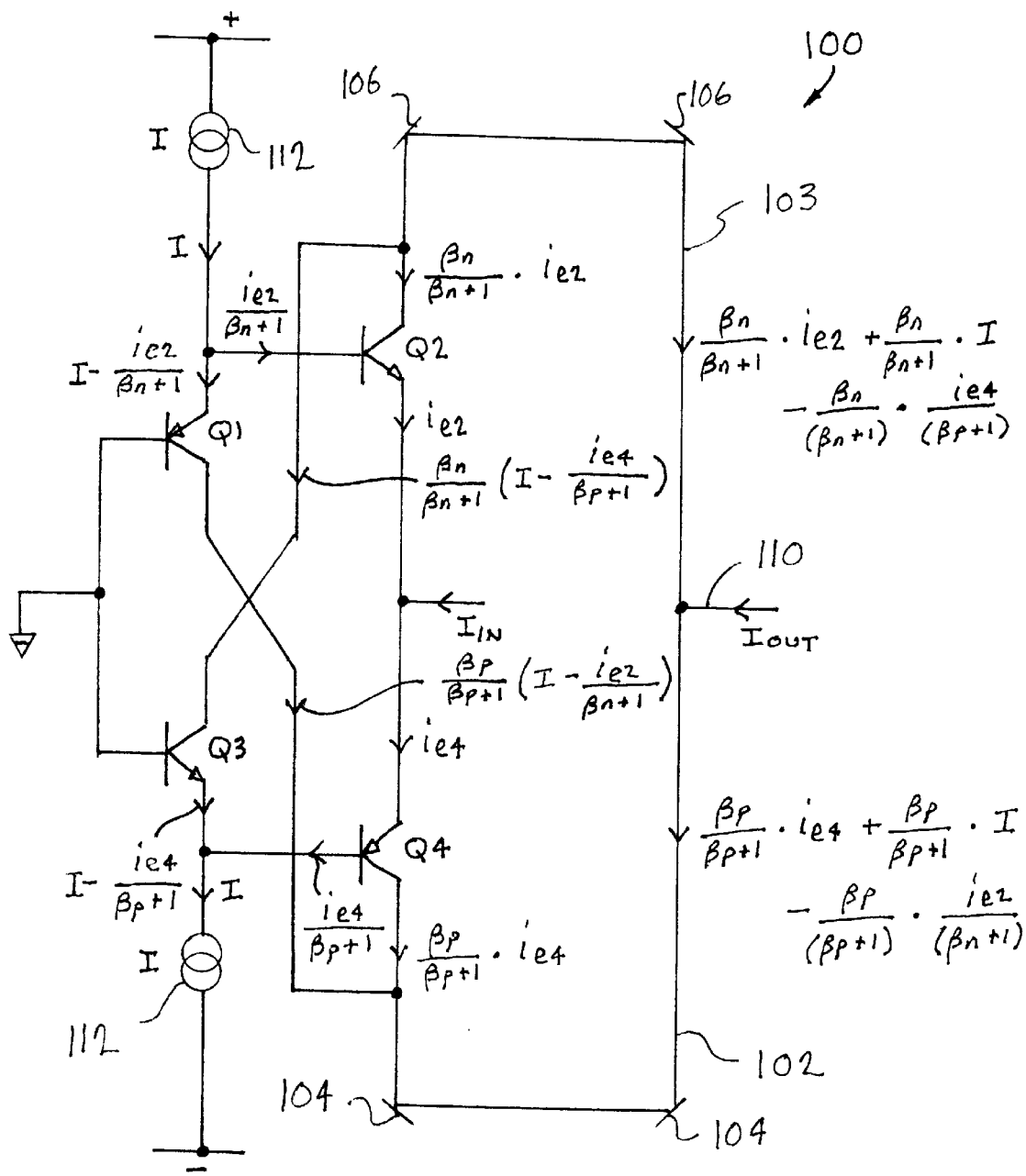
FIG. 2 is a schematic diagram illustrating a current-to-current impedance converter according to one embodiment of the present invention.

FIG. 2 is a schematic diagram illustrating a current-to-current impedance converter 100 according to one embodiment of the present invention. The impedance converter 100 is implemented using a class 'AB' output stage that is coupled to a sink current mirror 104 and source current mirror 106. The output stage includes an upper or source NPN output transistor Q2 and a lower or sink PNP output transistor Q4. The upper output transistor Q2 is driven via a PNP driver transistor Q1. The lower output transistor Q4 is driven via an NPN driver transistor Q3. The current mirrors 104 and 106 can be implemented using any well-known mirror architectures having any suitable gain so long as the selected gain is common to both current mirrors 104 and 106. The impedance converter driver transistor Q1, Q3 collector currents can be seen to be re-circulated back into the output current paths 102 and 103 respectively. The driver transistor Q1, Q3 collector currents are circulated through the output current mirrors 104, 106 along with the collector currents of output transistors Q2 and Q4 themselves. The total collector current is then folded around by the suitably chosen current mirrors 104, 106, and the bias currents are subtracted, leaving the output current $I_{ouT}$ flowing in common current path 110. It can be seen that the collector currents flowing in Q1 and Q4 folded around by current mirror 104 where they are combined in current path 102; and the collector currents flowing in Q2 and Q3 are folded around by current mirror 106 where they are combined in current path 103. The total output current is then generated in a common output current path 110 where the error current is determined as:

$$I_{OUT}=(\beta_p/(\beta_p+1))\cdot i_{e4}+(\beta_p/(\beta_p+1)\cdot I-[(\beta_p\cdot i_{e2})/(\beta_p+1)(\beta_n+1)]-(\beta_n/(\beta_n+1))\cdot i_{e2}-(\beta_n/(\beta_n+1))\cdot I+[(\beta_n\cdot i_{e4})/(\beta_n+1)(\beta_p+1)]$$

Since each static current source I 112 is a constant and will contribute to a DC offset, it can be ignored, and $$I_{OUT}=(\beta_p/(\beta_p+1)\cdot i_{e4}-[(\beta_p\cdot i_{e2})/(\beta_p+1)(\beta_n+1)]-(\beta_n/(\beta_n+1)\cdot i_{e2}+[(\beta_n\cdot i_{e4})/(\beta_n+1)(\beta_p+1)],$$

and then $$I_{OUT}=(i_{e4}-i_{e2})(\beta_p\cdot\beta_n+\beta_p+\beta_n)/[(\beta_p+1)(\beta_n+1)]$$

$$I_{OUT}=I_{IN}\cdot(\beta_p\cdot\beta_n+\beta_p+\beta_n)/\mu(\beta_p+1)(\beta_n+1)]$$

$$I_{OUT}=I_{IN}-I_{IN}/(\beta_p+1)(\beta_n+1),$$

and the error is $$I_{OUT}-I_{IN}=I_{IN}/(\beta_p+1)(\beta_n+1)$$

The error current is then:

$$\text{error current}=-I_{IN}/(\beta_p+1)(\beta_n+1)+I[\beta_p/(\beta_p+1)-\beta_n/(\beta_n+1)] \quad (2)$$

where the second term is a DC offset as set forth above and the error currents are now second order in 1/β, a significant improvement over the prior art error current as set forth in equation (1).

Figure 3:
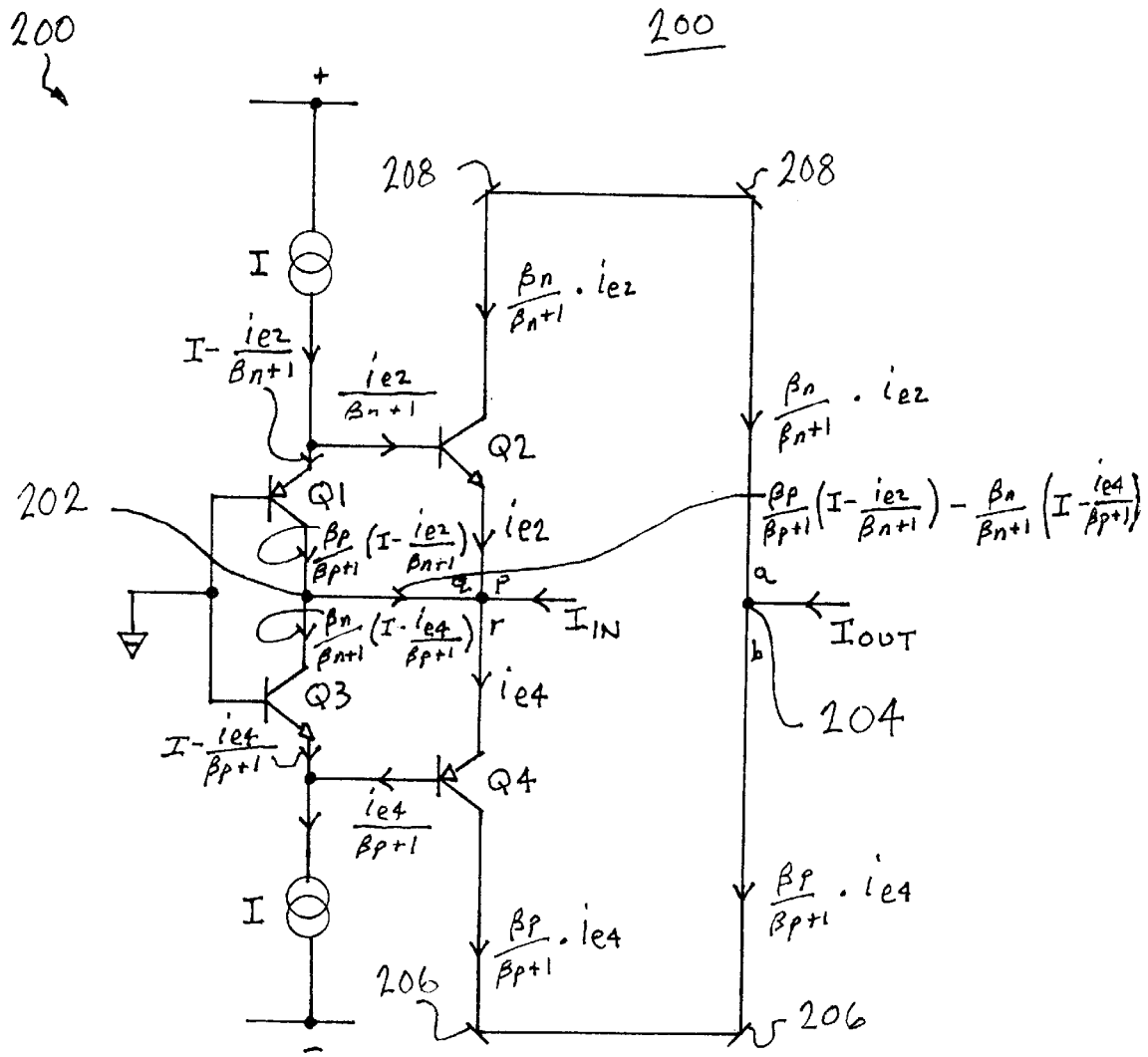
FIG. 3 is a diagram illustrating a current-to-current impedance converter according to another embodiment of the present invention.

FIG. 3 is a diagram illustrating a current-to-current impedance converter 200 according to another embodiment of the present invention. Again, the converter 200 is implemented via a class 'AB' output stage that is coupled to a plurality of suitably chosen current mirrors 206, 208. The current mirrors 206, 208 can be implemented using any well-known mirror architecture and can have a unity gain or can have a gain other than unity so long as the selected gain is common to both current mirrors 206, 208. The impedance converter driver transistor Q1 and Q3 collectors can be seen to be connected to a common input current summing node 202 along with the emitters of the output transistors Q2 and Q4. The driver transistor Q1, Q3 collector currents are also forced to proceed out through the current mirrors 206, 208, where again, error terms that are first order in 1/β are subtracted and cancelled at the common output summing node 204. The output current error is then:

$$a-I_{OUT}=b$$

$$I_{OUT}=b-a$$

$$p+q+I_{IN}=r$$

$$I_{IN}=r-p-q$$

error=$I_{OUT}-I_{IN}$, where $$I_{OUT}=[\beta_p/(\beta_p+1)]\cdot i_{e4}-[\beta_n/(\beta_n+1)]\cdot i_{e2}$$

and $$I_{IN}=i_{e4}-i_{e2}-\{[\beta_p/(\beta_p+1)](I-i_{e2}/(\beta_n+1))\}+\{[\beta_n/(\beta_n+1)](I-i_{e4}/(\beta_p+1))\}$$

The error is then:

$$\text{error} = [i_{e2} - i_{e4} + I(\beta_p - \beta_n)] / [(\beta_p+1)(\beta_n+1)]$$

where, for large $\beta$, $$i_{e2} - i_{e4} \approx -I_{IN} + I\left(\frac{1}{\beta_p} - \frac{1}{\beta_n}\right) + i_{e2}\left(\frac{1}{\beta_n}\right) - i_{e4}\left(\frac{1}{\beta_p}\right)$$

The error is, after keeping terms that are $2^{nd}$ order and $1^{st}$ order in $1/\beta$ times the signal and bias current, respectively:

$$\text{error current} \approx -I_{IN}/[(\beta_p+1)(\beta_n+1)] + I\{(\beta_p - \beta_n)/([(\beta_p+1)(\beta_n+1)]\} \quad (3)$$

where again, the second term is a DC offset, and the error currents are now second order in $1/\beta$, a significant improvement over the prior art.

The present low distortion current-to-current impedance converter circuits 100, 200 can accommodate a wide variety of applications and processing and fabrication technologies. The impedance converter circuit 200, for example, can be used to minimize the well-known Miller effects, but at the expense of requiring the input current source to now also drive the collector-substrate capacitance of the driver transistors Q1 and Q3. This collector-substrate capacitance may combine with the input impedance of the output transistors Q2 and Q4 to increase peaking at the upper limit of the circuit 200 bandwidth. The present low distortion current-to-current impedance converter circuit 100 presents neither of the foregoing issues, but now has a Miller effect at the driver (Q1, Q3) stage. As stated above therefore, process and application specifications will determine where the driver collector impedance is to be connected within the output circuit comprising transistors Q2 and Q4.

In view of the above, it can be seen the present invention presents a significant advancement in the art of current-to-current impedance converter circuit technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a low distortion current-to-current impedance converter according to the inventive principles set forth herein above.

What is claimed is:

1. A current-to-current impedance converter comprising: a class 'AB' output stage including a first output transistor having a first output current path associated therewith, a second output transistor having a second output current path associated therewith, a first current mirror operational to circulate first output transistor collector current into the first output current path, and a second current mirror operational to circulate second output transistor collector current into the second output current path, wherein the first output current path and the second output current path are connected to a common output current path;
   a first driver transistor coupled to the first and second output transistors and having a finite gain $\beta$; and
   a second driver transistor coupled to the first and second output transistors and having a finite gain $\beta$, wherein the first current mirror is further operational to re-circulate the first driver transistor collector current back into the first output current path, and further wherein the second current mirror is further operational to re-circulate the second driver transistor collector current back into the second output current path, such that an error current flowing in the output current path can be minimized.

2. The current-to-current impedance converter according to claim 1 wherein the first and second output transistors, the first and second driver transistors, the second current mirror and the first current mirror are operational to establish an error current flowing in the common output current path that is substantially devoid of first order in $1/\beta$ transistor effects.

3. The current-to-current impedance converter according to claim 1 wherein the first and second output transistors, the first and second driver transistors, the second current mirror and the first current mirror are operational to establish an error current flowing in the common output current path that comprises substantially second order in $1/\beta$ transistor effects.

4. The current-to-current impedance converter according to claim 3 wherein the first and second output transistors, the first and second driver transistors, the second current mirror and the first current mirror are operational to establish an error current flowing in the common output current path that further comprises DC offset effects.

5. The current-to-current impedance converter according to claim 1 further comprising a pair of current sources, each current source operational to provide bias current for a respective one of the driver transistors.

6. The current-to-current impedance converter according to claim 5 wherein each current source within the pair of current sources is a static current source.

7. The current-to-current impedance converter according to claim 1 wherein each driver transistor and each output transistor comprises an emitter, collector and base, wherein the emitters of the output transistors are connected to a common input and further connected to the collectors of the driver transistors, and further wherein the collector of each output transistor is coupled to a common output node.

8. The current-to-current impedance converter according to claim 7 wherein the base of each driver transistor is connected to a common ground and further wherein the emitter of the first driver transistor is connected to the base of the first output transistor and the emitter of the second driver transistor is connected to the base of the second output transistor.

9. The current-to-current impedance converter according to claim 8 further comprising a current source configured to supply current to the emitter of the first driver transistor and the base of the first output transistor.

10. The current-to-current impedance converter according to claim 9 further comprising a current sink configured to sink current from the emitter of the second driver transistor and the base of the second output transistor.

11. The current-to-current impedance converter according to claim 1 wherein each driver transistor and each output transistor comprises an emitter, collector and base, wherein the emitters of the output transistors are connected to a common input and further wherein the collectors of the driver transistors and the collectors of the output transistors are coupled to a common output node.

12. The current-to-current impedance converter according to claim 11 wherein the base of each driver transistor is connected to a common ground and further wherein the emitter of the first driver transistor is connected to the base of the first output transistor and the emitter of the second driver transistor is connected to the base of the second output transistor.

13. The current-to-current impedance converter according to claim 12 further comprising a current source configured to supply current to the emitter of the first driver transistor and the base of the first output transistor.

14. The current-to-current impedance converter according to claim 13 further comprising a current sink configured to sink current from the emitter of the second driver transistor and the base of the second output transistor.

15. A current-to-current impedance converter comprising:
   a first bipolar driver transistor having a collector, emitter and base;
   a second bipolar driver transistor having a collector, emitter and base;
   a first bipolar output transistor having a collector, emitter and base;
   a second bipolar output transistor having a collector, emitter and base;
   a current source configured to source DC current to a node common to the first driver transistor emitter and the first output transistor base; and
   a current sink configured to sink DC current from a node common to the second driver transistor emitter and the second output transistor base, wherein the base of the driver transistors are connected to a common ground and the emitters of the output transistors are connected to a common input, and further wherein the collector of the first driver transistor and the first output transistor are coupled via a first current mirror to a common output and the collector of the second driver transistor and the second output transistor are coupled via a second current mirror to the common output.

16. A current-to-current impedance converter comprising:
   a first bipolar driver transistor having a collector, emitter and base;
   a second bipolar driver transistor having a collector, emitter and base;
   a first bipolar output transistor having a collector, emitter and base;
   a second bipolar output transistor having a collector, emitter and base;
   a current source configured to source DC current to a node common to the first driver transistor emitter and the first output transistor base; and
   a current sink configured to sink DC current to a node common to the second driver transistor emitter and the second output transistor base,
   wherein the base of each driver transistor is connected to a common ground, and the emitters of the output transistors are connected to a common input and further connected to the collectors of the driver transistors, and further wherein the collector of each output transistor is coupled via a respective current mirror to a common output.

17. A current-to-current impedance converter comprising:
   a plurality of driver transistors; and
   a plurality of output transistors having a common low impedance input node and a common high impedance output node, wherein the driver transistors and the output transistors are configured to generate a current at the high impedance output node that is equal in magnitude to a current at the low impedance input node such that distortion current at the output node comprises an error current that is determined substantially by transistor second order inverse gain ($1/\beta$) effects.

18. The current-to-current impedance converter according to claim 17 wherein each transistor has a collector, emitter and base, and further wherein each output transistor emitter is connected to the low impedance input node and the collector of each output transistor and each driver transistor is coupled to the high impedance output node.

19. The current-to-current impedance converter according to claim 17 wherein each transistor has a collector, emitter and base, and further wherein each output transistor emitter and each driver transistor collector is connected to the low impedance input node and the collector of each output transistor is coupled to the high impedance output node.

20. A method of generating an output current from a high impedance output node that is equal in magnitude to a current input into a separate low impedance input node comprising the steps of:
   a) providing a current-to-current impedance converter having first and second driver transistors and further having first and second output transistors, wherein the converter has a high impedance output node and a separate low impedance input node;
   b) generating a first driver transistor collector current in response to a current at the low impedance input node;
   c) generating a second driver transistor collector current in response to the current at the low impedance input node;
   d) generating a first output transistor collector current in response to the current at the low impedance input node;
   e) generating a second output transistor collector current in response to the current at the low impedance input node; and
   f) combining the first driver transistor collector current, second driver transistor collector current, first output transistor collector current and second output transistor collector current to generate a current at the high impedance output node, wherein the current at the high impedance output node comprises a transistor second order in inverse gain ($1/\beta$) error current.

* * * * *